United States Patent [19]

Nitta et al.

[11] Patent Number: 5,945,517
[45] Date of Patent: Aug. 31, 1999

[54] CHEMICAL-SENSITIZATION PHOTORESIST COMPOSITION

[75] Inventors: Kazuyuki Nitta, Ebina; Kazufumi Sato, Sagamihara; Toshiharu Shimamaki, Neyagawa; Kunio Hayakawa, Ibaraki; Shin-ya Kuramoto, Minoh, all of Japan

[73] Assignees: Tokyo Ohka Kogyo Co., Ltd.; Daito Chemix Corporation, both of Japan

[21] Appl. No.: 09/119,640

[22] Filed: Jul. 21, 1998

Related U.S. Application Data

[63] Continuation-in-part of application No. 08/898,320, Jul. 22, 1997.

[30] Foreign Application Priority Data

| Jul. 24, 1996 | [JP] | Japan | 8-195098 |
| Jul. 24, 1997 | [JP] | Japan | 9-198953 |
| Jul. 24, 1997 | [JP] | Japan | 9-198954 |
| Jul. 24, 1997 | [JP] | Japan | 9-198955 |

[51] Int. Cl.$^6$ .......................... C07D 407/02; C07C 245/14
[52] U.S. Cl. .......................... 534/558; 534/560; 534/564
[58] Field of Search .................. 534/558, 560, 534/564

[56] References Cited

U.S. PATENT DOCUMENTS

| 4,522,911 | 6/1985 | Clecak et al. | 430/192 |
| 4,601,969 | 7/1986 | Clecak et al. | 430/192 |
| 4,735,885 | 4/1988 | Hopf et al. | 430/192 |
| 4,883,740 | 11/1989 | Schwalm et al. | 430/270.1 |
| 5,191,124 | 3/1993 | Schwalm et al. | 568/18 |
| 5,216,135 | 6/1993 | Urano et al. | 534/556 |
| 5,250,669 | 10/1993 | Ogawa et al. | 534/557 |
| 5,338,641 | 8/1994 | Pawlowski et al. | 430/165 |
| 5,340,682 | 8/1994 | Pawlowski et al. | 430/165 |
| 5,350,660 | 9/1994 | Urano et al. | 430/176 |
| 5,424,166 | 6/1995 | Pawlowski et al. | 430/157 |
| 5,756,689 | 5/1998 | Busman et al. | 534/560 |

*Primary Examiner*—Fiona T. Powers
*Attorney, Agent, or Firm*—Wenderoth, Lind & Ponack, L.L.P.

[57] ABSTRACT

Proposed is a positive- or negative-working chemical-sensitization photoresist composition having advantages in respect of the contrast and resolution of patterning, photosensitivity and cross sectional profile of the patterned resist layer as well as in respect of stability of the latent image formed by pattern-wise exposure to light before post-exposure baking treatment. The composition comprises: (A) 100 parts by weight of a film-forming resinous ingredient which causes a change, i.e. increase or decrease, of solubility in an aqueous alkaline solution by the interaction with an acid; and (B) from 0.5 to 20 parts by weight of a radiation-sensitive acid-generating agent which is a diazomethane compound represented by the general formula $$R^1-SO_2-C(=N_2)-SO_2-R^2,$$

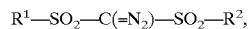

in which $R^1$ and $R^2$ are each, independently from the other, a monovalent cyclic group substituted on the cyclic nucleus by an acid-dissociable group such as a tert-butoxycarbonyl and acetal groups. Several novel diazomethane compounds are disclosed.

9 Claims, 8 Drawing Sheets

CHEMICAL-SENSITIZATION PHOTORESIST COMPOSITION

This is a continuation-in-part application from a copending U.S. patent application Ser. No. 08/898,320 filed Jul. 22, 1997.

BACKGROUND OF THE INVENTION

The present invention relates to a novel chemical-sensitization photoresist composition or, more particularly, to a chemical-sensitization photoresist composition capable of giving a patterned resist layer with high contrast, high pattern resolution, high film thickness retention and high photosensitivity as well as an excellent cross sectional profile of the patterned resist layer and also having an advantage in respect of the stability of the latent image before development after pattern-wise exposure to actinic rays.

In the photolithographic patterning technology for the manufacture of various kinds of semiconductor devices, liquid crystal display panels and the like by utilizing a photoresist composition, it is a remarkable trend in recent years that so-called chemical-sensitization photoresist compositions are acquiring more and more prevalence among various types of photoresist compositions. The chemical-sensitization photoresist composition here implied is a photoresist composition containing an chemical agent capable of releasing an acid by the irradiation with actinic rays while the thus generated acid has a catalytic activity on the radiation-induced changes in the solubility of the resinous ingredient in an aqueous alkaline developer solution so that the photoresist composition has a high photosensitivity with a relatively small exposure dose.

Chemical-sensitization photoresist compositions can be classified into two types including the positive-working photoresist compositions and negative-working photoresist compositions depending on the solubility change of the resist layer in an alkaline developer solution caused by the irradiation with actinic rays. The basic ingredients of a chemical-sensitization photoresist composition include the above mentioned radiation-sensitive acid-generating agent and a film-forming resinous ingredient which causes a change of the solubility in an aqueous alkaline developer solution by interacting with the acid released from the acid-generating agent by the pattern-wise exposure of the resist layer to actinic rays.

The formulations of the chemical-sensitization positive- and negative-working photoresist compositions are different in the film-forming resinous ingredients. Namely, the chemical-sensitization positive-working photoresist composition usually contains, as the film-forming resinous ingredient, a polyhydroxystyrene resin of which a part of the hydroxyl groups are substituted for the hydroxyl hydrogen atoms by solubility-reducing protective groups such as tert-butoxycarbonyl groups, tetrahydropyranyl groups and the like while the film-forming resinous ingredient in the chemical-sensitization negative-working photoresist composition is usually a combination of a polyhydroxystyrene resin, which is optionally substituted for a part of the hydroxyl hydrogen atoms by the solubility-reducing protective groups mentioned above, or a novolak resin with an acid-crosslinkable agent such as melamine resins, urea resins and the like.

Various attempts and proposals have been made heretofore for selection of the radiation-sensitive acid-generating agent used in the above described chemical-sensitization photoresist compositions including, for example, certain diazomethane compounds disclosed in Japanese Patent Kokai 3-103854, 4-210960 and 4-217249.

It is also known in the prior art to use an acid-generating agent which is a compound having an acid-dissociable group in the molecule as disclosed in Japanese Patent Kokai 64-26550 and 64-35433. The acid-generating compounds disclosed there, however, are limited to onium salt compounds. A chemical-sensitization photoresist composition formulated with such an onium salt compound as the acid-generating agent has a disadvantage that the performance thereof is subject to the adverse influences of standing waves of the exposure light so that the patterned resist layer formed therefrom sometimes has wavy side lines of the cross sectional profile. The above mentioned Japanese Patent Kokai 3-103854, 4-210960 and 4-217249 also teach use of a certain diazomethane compound as the acid-generating agent and, among these diazomethane compounds, the non-aromatic diazomethane compounds, such as bis (cyclohexylsulfonyl) diazomethane, in particular, are highly transparent to excimer laser beams of 248 nm wavelength and capable of giving a high pattern resolution though with disadvantages in respect of the relatively low efficiency for the generation of an acid as well as a low patterning contrast since the acid generated therefrom is a weak acid so that the photoresist composition formulated therewith can hardly exhibit a high photosensitivity. In addition, the resist layer obtained from a resist composition formulated with such a diazomethane compound as the acid-generating agent is disadvantageous in respect of the relatively low stability of the latent image, which is formed by the pattern-wise exposure to light, before the post-exposure baking treatment.

SUMMARY OF THE INVENTION

The present invention accordingly has an object to provide a novel high-sensitivity chemical-sensitization photoresist composition which is capable of giving a patterned resist layer with high contrast, high film thickness retention and high pattern resolution and having an excellently orthogonal cross sectional profile and also is advantageous in respect of the stability of the latent image formed by the pattern-wise exposure of the photoresist layer to actinic rays before post-exposure baking treatment and development. The discovery leading to completion of the present invention is that the above mentioned high performance of the photoresist composition can be accomplished by the use of a specific diazomethane compound having an acid-dissociable group in the molecule as the radiation-sensitive acid-generating agent.

Thus, the present invention provides a chemical-sensitization photoresist composition which comprises, as a uniform solution in an organic solvent:

(A) 100 parts by weight of a film-forming resinous ingredient which causes a change of solubility in an aqueous alkaline solution by the interaction with an acid; and (B) from 0.5 to 20 parts by weight of a radiation-sensitive acid-generating agent which is a diazomethane compound represented by the general formula $$R^1\text{---}SO_2\text{---}C(=N_2)\text{---}SO_2\text{---}R^2, \tag{I}$$

in which $R^1$ and $R^2$ are each, independently from the other, a monovalent cyclic group selected from the group consisting of aromatic cyclic groups substituted on the aromatic nucleus by an acid-dissociable group, such as tert-butoxycarbonyl group and acetal groups, and aliphatic cyclic groups, such as a bornyl group, substituted by the above mentioned acid-dissociable group.

DETAILED DESCRIPTION OF THE PREFERRED EMBODIMENTS

Figure 1A:
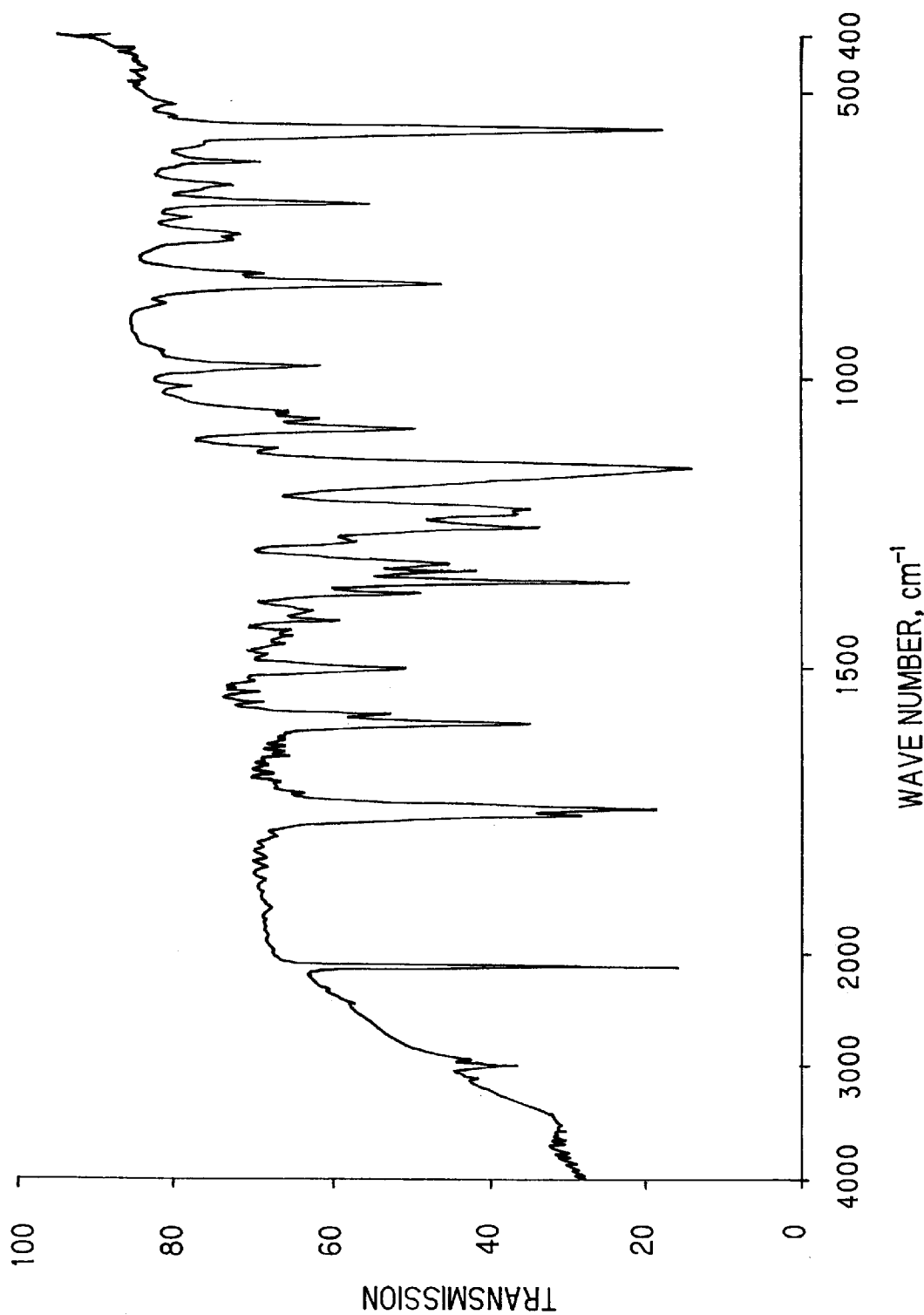
FIGS. 1A and 1B are an infrared absorption spectrum and $^1$H-NMR absorption spectrum, respectively, of the diazomethane compound prepared in Synthesis 1.

The component (A) in the inventive photoresist composition is a film-forming resinous ingredient which is selected from those conventionally used in the chemical-sensitization photoresist compositions of the positive-working and negative-working types without particular limitations.

When the inventive chemical-sensitization photoresist composition is of the positive-working type, the component (A) is a hydroxyl group-containing alkali-soluble resin rendered alkali-insoluble by substitution for at least a part of the hydroxyl groups with acid-dissociable protective groups. When the inventive chemical-sensitization photoresist composition is of the negative-working type, the component (A) is a combination of an alkali-soluble resin or a hydroxyl group-containing alkali-soluble resin rendered alkali-insoluble by substitution for at least a part of the hydroxyl groups by acid-dissociable protective groups and an acid-crosslinkable compound which is a curable compound by forming crosslinks by the interaction with an acid acting as a catalyst.

Namely, a positive-working chemical-sensitization photoresist composition according to the invention comprises, as the essential ingredients, the above mentioned alkali-insolubilized resin as the component (A) and a radiation-sensitive acid-generating agent as the component (B). When a photoresist layer formed from such a positive-working photoresist composition is pattern-wise exposed to actinic rays such as ultraviolet light, the acid-generating agent in the exposed areas is photochemically decomposed to generate an acid which interacts with the component (A) to cause dissociation of the acid-dissociable protective groups so that the photoresist layer in the exposed areas is imparted with solubility in an aqueous alkaline solution and selectively dissolved away in the development treatment with an aqueous alkaline developer solution to form a positively patterned resist layer. A negative-working chemical-sensitization photoresist composition according to the invention comprises, as the essential ingredients, a combination of an alkali-soluble resin or a hydroxyl group-containing resin rendered alkali-insoluble by substitution for a part of the hydroxyl groups and an acid-crosslinkable compound as the component (A) and a radiation-sensitive acid-generating agent as the component (B). When a photoresist layer formed from such a negative-working photoresist composition is pattern-wise exposed to actinic rays such as ultraviolet light, the acid-generating agent in the exposed areas is photochemically decomposed to generate an acid which interacts with the acid-crosslinkable compound to cause crosslinking thereof so that the photoresist layer in the exposed areas is insolubilized in an aqueous alkaline solution while the photoresist layer in the unexposed areas is selectively dissolved away in the development treatment with an aqueous alkaline developer solution to form a negatively patterned resist layer on the substrate surface.

Examples of the above mentioned alkali-soluble resin include novolak resins prepared by the condensation reaction between a phenolic compound such as phenol, m- and p-cresols, xylenols, trimethyl phenols and the like and an aldehyde compound such as formaldehyde, hydroxystyrene-based polymers exemplified by homopolymers of a hydroxystyrene, copolymers of a hydroxystyrene and another styrene monomer, of which at least 70% by moles of the monomeric units are derived from the hydroxystyrene, and copolymers of a hydroxystyrene with an acrylic monomer such as acrylic and methacrylic acids and derivatives thereof, (meth)acrylic acid-based resins such as copolymers of (meth)acrylic acid and a derivative thereof, and so on.

The hydroxyl group-containing alkali-soluble resins to be insolubilized by substitution of acid-dissociable protective groups for at least a part of the phenolic or carboxylic hydroxyl groups include homopolymers of a hydroxystyrene, copolymers of a hydroxystyrene and another styrene monomer, copolymers of a hydroxystyrene with an acrylic monomer such as acrylic and methacrylic acids and derivatives thereof and (meth)acrylic acid-based resins such as copolymers of (meth)acrylic acid and a derivative thereof.

The above mentioned styrene monomer to be copolymerized with a hydroxystyrene is exemplified by styrene, α-methylstyrene, p- and o-methylstyrenes, p-methoxystyrene, p-chlorostyrene and the like. The above mentioned derivative of (meth)acrylic acid is exemplified by methyl (meth)acrylate, ethyl (meth)acrylate, 2-hydroxyethyl (meth)acrylate, 2-hydroxypropyl (meth)acrylate, (meth) acrylamide, (meth)acrylonitrile and the like.

The above mentioned acid-dissociable protective group to substitute the phenolic or carboxylic hydroxyl group in the hydroxyl group-containing resins is exemplified by tert-alkoxycarbonyl groups such as tert-butoxycarbonyl and tert-amyloxycarbonyl groups, tert-alkyl groups such as tert-butyl group, alkoxyalkyl groups such as ethoxyethyl and methoxypropyl groups, acetal groups such as tetrahydropyranyl and tetrahydrofuranyl groups, benzyl group, trimethylsilyl group and so on. It is preferable that the degree of substitution of these protective groups for the hydroxyl groups of the hydroxyl group-containing polymer is in the range from 1 to 60% or, more preferably, from 10 to 50%.

The component (A) of the positive-working chemical-sensitization photoresist composition as a class of the inventive photoresist composition is preferably a polyhydroxystyrene resin which is insolubilized in an aqueous alkaline solution by substitution of tert-butoxycarbonyl groups or alkoxyalkyl groups such as ethoxyethyl and methoxypropyl groups for a part of the hydroxyl groups. In particular, the component (A) in the positive-working composition is preferably a combination of a first polyhydroxystyrene resin substituted by tert-butoxycarbonyl groups for 10 to 50% or, preferably, 15 to 40% of the hydroxyl groups and a second polyhydroxystyrene resin substituted by alkoxyalkyl groups such as ethoxyethyl and methoxy-n-propyl groups for 10 to 50% or, preferably, 15 to 40% of the hydroxyl groups in a weight proportion of from 5:95 to 50:50 or, preferably, from 10:90 to 30:70.

The component (A) of the negative-working chemical-sensitization photoresist composition as the other class of the inventive photoresist composition is a combination of an alkali-soluble resin selected from novolak resins, hydroxystyrene-based resins and (meth)acrylic acid-based resins or a hydroxyl group-containing alkali-soluble resin substituted by acid-dissociable protective groups to be alkali-insolubilized and an acid-crosslinkable compound. The acid-crosslinkable compound can be selected from those conventionally used in the negative-working chemical-sensitization photoresist compositions without particular limitations. Examples of suitable acid-crosslinkable compounds include amino resins having hydroxyl or alkoxy groups such as melamine resins, urea resins, guanamine resins, glycoluryl-formaldehyde resins, succinylamide-formaldehyde resins, ethyleneurea-formaldehyde resins and the like. These resinous compounds can be readily obtained by the methylolation reaction of melamine, urea, guanamine, glycoluryl, succinylamide, ethyleneurea and the like with formaldehyde in boiling water, optionally, followed by the alkoxylation reaction with a lower alcohol. Suitable amino resins are available as a commercial product under the trade names of Nikalacs MX-750, MW-30 and MX-290 (each a product by Sanwa Chemical Co.) and can be used as such in the present invention.

Besides, the acid-crosslinkable compound can be selected from benzene compounds having alkoxy groups in a molecule such as 1,3,5-tris(methoxymethoxy)benzene, 1,2,4-tris (isopropoxymethoxy)benzene, 1,4-bis(sec-butoxymethoxy) benzene and the like and phenolic compounds having hydroxyl or alkoxy groups in the molecule such as 2,6-di (hydroxymethyl)-p-cresol, 2,6-di(hydroxymethyl)-p-tert-butyl phenol and the like.

The above named various kinds of acid-crosslinkable compounds can be used either singly or as a combination of two kinds or more according to need.

The amount of the acid-crosslinkable compound in the negative-working chemical-sensitization photoresist composition of the invention is in the range from 3% to 70% by weight or, preferably, from 5% to 50% by weight based on the amount of the alkali-soluble resinous ingredient as the component (A). When the amount of the acid-crosslinkable compound is too small, the photoresist composition cannot be imparted with high photosensitivity while, when the amount thereof is too large, the resist layer formed from the photoresist composition on the substrate surface can hardly be uniform enough along with a decrease in the developability of the resist layer not to give an excellently patterned resist layer.

The alkali-soluble resin used as the component (A) in the inventive photoresist composition should preferably have a weight-average molecular weight in the range from 2000 to 20000 and the molecular weight distribution thereof should be as narrow as possible from the standpoint of obtaining a resist layer having good heat resistance and high pattern resolution. Dispersion of the molecular weight distribution represented by the ratio of the weight-average molecular weight to the number-average molecular weight $M_w:M_n$ should not exceed, though dependent on the types of the resinous compounds, 3.5 or, preferably, 3.0 for novolak resins and 3.5 or, preferably, 2.5 for hydroxystyrene-based resins.

The component (B), which is a radiation-sensitive acid-generating agent, as the other essential ingredient in the inventive photoresist composition, is a diazomethane compound represented by the general formula $$R^1—SO_2—C(=N_2)—SO_2—R^2, \quad (I)$$

in which $R^1$ and $R^2$ are each, independently from the other, a monovalent cyclic group selected, though not particularly limitative, preferably from the group consisting of aromatic cyclic groups substituted on the aromatic nucleus by an acid-dissociable group, such as tert-butoxycarbonyl group and acetal groups, and aliphatic cyclic groups, such as a bornyl group, substituted by the above mentioned acid-dissociable group.

The aromatic cyclic group substituted on the aromatic nucleus by an acid-dissociable group denoted by $R^1$ or $R^2$ in the above given general formula (I) is not particularly limitative. The aromatic cyclic group is exemplified by those cyclic groups completely unsaturated around the whole ring structure such as phenyl, naphthyl, furyl, thienyl, pyridyl and benzoxazolyl groups. These aromatic cyclic groups can optionally be substituted by various substituents such as halogen atoms, nitro group, alkyl groups, alkoxy groups and the like. Phenyl group is particularly preferred as the aromatic cyclic group in respect of the high photosensitivity of the photoresist composition.

The aliphatic cyclic group, on the other hand, is selected, though not particularly limitative, preferably from the group consisting of saturated aliphatic cyclic hydrocarbon groups, such as cyclopentyl and cyclohexyl groups, unsaturated aliphatic cyclic hydrocarbon groups, such as cyclopentenyl and cyclohexenyl groups, and polycyclic hydrocarbon groups such as bornyl group, of which bornyl group is particularly preferable in respects of the good availability of the starting material for synthesis as well as the easiness in the synthetic procedure.

The acid-dissociable group to substitute the above mentioned monovalent cyclic group is selected from those groups capable of reducing the alkali-solubility of the compound and also capable of being dissolved by the interaction with an acid so as to increase the alkali-solubility of the compound, as is known in the formulation of chemical-sensitization photoresist compositions. Examples of such an acid-dissociable group include tert-alkyloxycarbonyl groups such as tert-butoxycarbonyl and tert-amyloxycarbonyl groups, tert-alkyloxycarbonylalkyl groups such as tert-butoxycarbonylmethyl group, tert-alkyl groups such as tert-butyl group, alkoxyalkyl groups such as ethoxyethyl and methoxypropyl groups, acetal groups such as tetrahydropyranyl and tetrahydrofuranyl groups, benzyl group, trimethylsilyl group and so on.

Preferable among the above named acid-dissociable groups are the tert-alkyloxycarbonyl groups such as tert-butoxycarbonyl group, tert-alkyloxycarbonylalkyl groups such as tert-butoxycarbonylmethyl group, alkoxyalkyl groups such as ethoxyethyl and methoxypropyl groups and acetal groups such as tetrahydropyranyl and tetrahydrofuranyl groups in respect of the high contrast of the photolithographic patterning as well as the good availability and inexpensiveness of the compounds used for introducing these groups to form the groups denoted by $R^1$ and $R^2$.

Several examples of the groups denoted by $R^1$ and $R^2$ include: tert-butoxycarbonyloxy phenyl groups of the formula

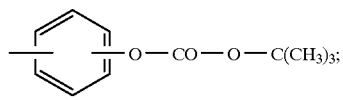

(2-tetrahydropyranyl)oxy phenyl groups of the formula

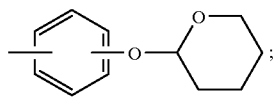

(2-tetrahydropyranyl)oxycarbonyl phenyl groups of the formula

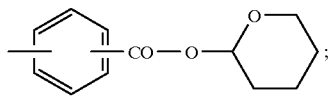

tert-butoxycarbonylmethyloxy phenyl groups of the formula

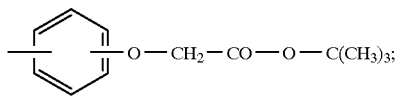

(2-tetrahydropyranyl)oxycyclohexyl groups of the formula

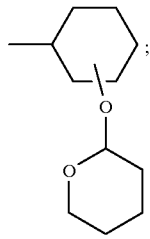

(2-tetrahydropyranyl)oxy-10-bornyl groups of the formula

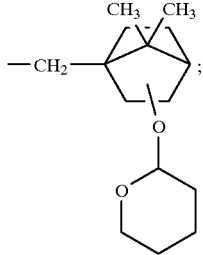

(1-ethoxyethoxy)cyclohexyl groups of the formula

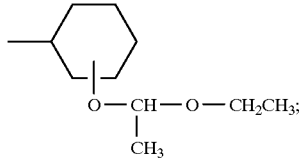

and (1-ethoxyethoxy)-10-bornyl groups of the formula

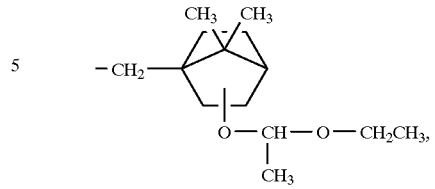

of which 4-tert-butoxycarbonyloxy phenyl group, 4-(2-tetrahydropyranyl)oxy phenyl group, 2-(2-tetrahydropyranyl)oxycarbonyl phenyl group, 4-tert-butoxycarbonylmethyloxy phenyl group, 2-(2-tetrahydropyranyl)oxycyclohexyl group, 2-(2-tetrahydropyranyl)oxy-10-bornyl group, 2-(1-ethoxyethoxy)-cyclohexyl group and 2-(1-ethoxyethoxy)-10-bornyl group are particularly preferable.

The diazomethane compound represented by the general formula (I) can be synthesized according to a known method disclosed, for example, in Japanese Patent Kokai 4-210960. The synthetic route of the compound, when $R^2$ is the same as $R^1$, is as follows. Namely, a hydroxyl- or carboxyl-containing thiol compound of the formula RSH, in which R is a monovalent cyclic group having a hydroxyl or carboxyl group, is reacted with dichloromethane in the presence of a basic compound such as triethylamine in an organic solvent such as a lower alcohol, e.g., methyl and ethyl alcohols, and an aromatic hydrocarbon solvent, e.g., toluene, according to the reaction equation $$2RSH + CH_2Cl_2 \rightarrow RSCH_2SR,$$

and the reaction product $RSCH_2SR$ is oxidized with hydrogen peroxide in a solvent such as water or a lower alcohol in the presence of a catalyst such as sodium tungstate to give a disulfone compound of the formula $RSO_2CH_2SO_2R$, which is finally reacted with tosyl azide in the presence of a basic compound such as triethylamine in an organic solvent such as a lower alcohol, e.g., methyl and ethyl alcohols, and an aromatic hydrocarbon solvent, e.g., toluene, to give the desired diazomethane compound followed by introduction of the acid-dissociable groups by substitution for the hydroxyl or carboxyl groups to give the diazomethane compound of the general formula (I).

The diazomethane compound of the general formula (I), of which the groups denoted by $R^1$ and $R^2$ are different each Zfrom the other, can be prepared by the following synthetic route. Thus, a first hydroxyl- or carboxyl-containing thiol compound of the formula RSH and paraformaldehyde $(CH_2O)_n$ are mixed to form a mixture to which hydrogen chloride gas is introduced at 10° C. or below and then anhydrous calcium chloride is added to effect a reaction forming a compound of the formula $RSCH_2Cl$. This compound is reacted with a second hydroxyl- or carboxyl-containing thiol compound of the formula R'SH, in which R' is a hydroxyl- or carboxyl-containing monovalent cyclic group different from R, in an organic solvent such as a lower alcohol, e.g., methyl and ethyl alcohols, and an aromatic hydrocarbon solvent, e.g., toluene, in the presence of an alkaline compound such as sodium hydroxide to give a compound of the formula $RSCH_2SR'$ which is oxidized with hydrogen peroxide and reacted with tosyl azide followed by introduction of the acid-dissociable groups in the same manner as described above to give the desired diazomethane compound of the general formula (I).

Although the acid-dissociable groups of $R^1$ and $R^2$ can be the same ones or can be different each from the other, as is mentioned before, it should be noted that the synthetic procedure is simple and the cost for the preparation is low for the preparation of a diazomethane compound of which the groups $R^1$ and $R^2$ are the same as compared with a diazomethane compound of which the groups $R^1$ and $R^2$ are different each from the other.

Several examples of the diazomethane compound of the general formula (I) suitable as the component (B) include: bis(4-tert-butoxycarbonyloxyphenyl sulfonyl) diazomethane of the formula

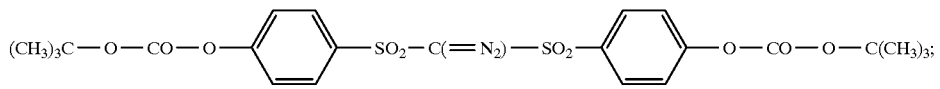

bis[4-(2-tetrahydropyranyl)oxyphenyl sulfonyl] diazomethane of the formula

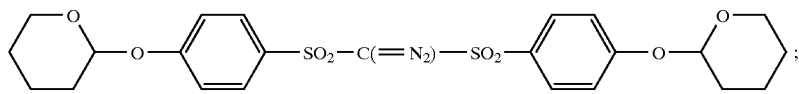

bis[2-(2-tetrahydropyranyl)oxycarbonylphenyl sulfonyl] diazomethane of the formula

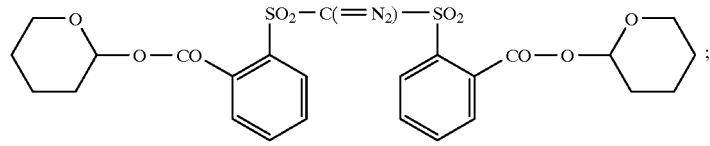

bis(4-tert-butoxycarbonylmethyloxyphenyl sulfonyl) diazomethane of the formula

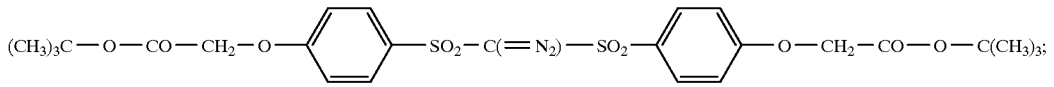

bis[2-(2-tetrahydropyranyl)oxycyclohexyl sulfonyl] diazomethane of the formula

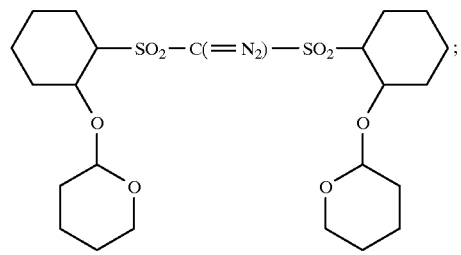

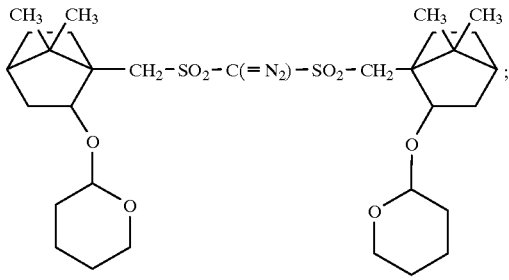

bis[2-(2-tetrahydropyranyl)oxy-10-bornyl sulfonyl] diazomethane of the formula bis[2-(1-ethoxyethoxy)cyclohexyl sulfonyl] diazomethane of the formula

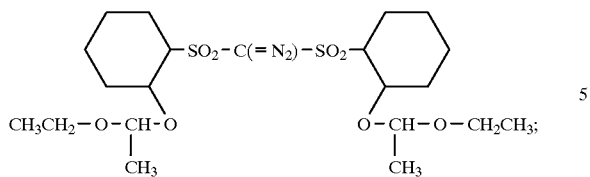

bis[2-(1-ethoxyethoxy)-10-bornyl sulfonyl] diazomethane of the formula

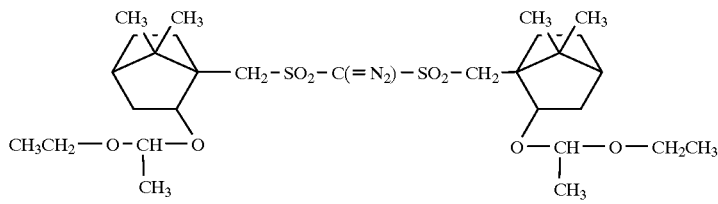

and the like. These diazomethane compounds can be used either singly or as a combination of two kinds or more according to need as the component (B).

Among the various diazomethane compounds useful as the component (B) in the inventive photoresist composition, the compounds belonging to one of the following three classes (I), (II) and (III), each of which is a novel compound not known in the prior art nor described in any literatures, are particularly useful.

(I) The first class includes the diazomethane compounds represented by the general formula

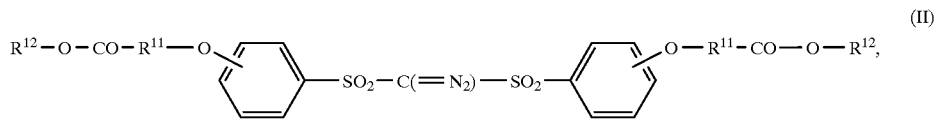

(II)

in which each $R^{11}$ is, independently from the other, a lower alkylene group having 1 to 4 carbon atoms and each $R^{12}$ is, independently from the other, a tertiary alkyl group having 4 to 8 carbon atoms.

(II) The second class includes the diazomethane compounds represented by the general formula

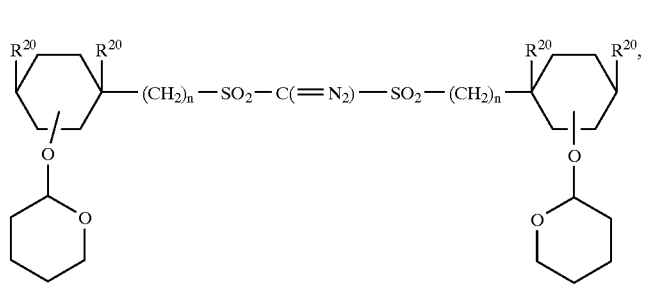

(III)

in which the two $R^{20}$ groups on the same ring structure are each a hydrogen atom or jointly form an endo (dimethylmethylene) group and each of the subscripts n is a number of 0 or 1.

(III) The third class includes the diazomethane compounds represented by the general formula $$\text{R}^{32}\text{O}-\text{CHR}^{31}-\text{O}\underset{\text{R}^{30}}{\overset{\text{R}^{30}}{\bigotimes}}-(\text{CH}_2)_n-\text{SO}_2-\text{C}(=\text{N}_2)-\text{SO}_2-(\text{CH}_2)_n-\underset{\text{R}^{30}}{\overset{\text{R}^{30}}{\bigotimes}}\text{O}-\text{CHR}^{31}-\text{OR}^{32},\quad\text{(IV)}$$

in which the two $R^{30}$ groups on the same ring structure are each a hydrogen atom or jointly form an endo (dimethylmethylene) group, each $R^{31}$ is, independently from the other, a lower alkyl group having 1 to 4 carbon atoms, each $R^{32}$ is, independently from the other, a lower alkyl group having 1 to 4 carbon atoms and each of the subscript n is, independently from the other, a number of 0 or 1.

In the general formula (II) representing the diazomethane compounds of the first class, the alkylene group denoted by $R^{11}$ can be either straightly linear or branched as exemplified by methylene, ethylene, trimethylene, tetramethylene, isopropylene and isobutylene groups and the tertiary alkyl group denoted by $R^{12}$ is exemplified by tert-butyl, tert-pentyl and 1,1-dimethylbutyl groups.

The amount of the diazomethane compound as the component (B) is in the range from 0.5 to 20 parts by weight or, preferably, from 1.0 to 10 parts by weight per 100 parts by weight of the component (A) from the standpoint of obtaining good balance of the image-forming behavior and film-forming behavior of the resist composition and developability of the resist layer. When the amount thereof is too large, no good resist film can be formed from the photoresist composition along with a decrease in the developability of the resist layer for patterning.

The chemical-sensitization photoresist composition of the present invention can optionally be admixed with an amine compound to improve the quality of the photoresist layer and the patterned resist layer therefrom such as the orthogonality of the cross sectional profile and stability of the latent image formed by the pattern-wise exposure of the photoresist layer to actinic rays before the development treatment including, for example, aliphatic amines such as trimethyl amine, ethyl amine, diethyl amine, triethyl amine, n-propyl amine, di-n-propyl amine, tri-n-propyl amine and the like, aromatic amines such as benzylamine, aniline, N-methyl aniline, N,N-dimethyl aniline and the like and heterocyclic amines such as pyridine, 2-methyl pyridine, 2-ethyl pyridine, 2,3-dimethyl pyridine and the like, of which triethyl amine is particularly effective in respect of the efficiency of improvement in the above mentioned properties. The amount of the above mentioned amine compound in the inventive photoresist composition is, when added, in the range from 0.01 to 1% by weight or, preferably, from 0.05 to 0.5% by weight based on the component (A).

It is further optional according to need that the photoresist composition of the invention is admixed with a carboxylic acid including saturated and unsaturated aliphatic carboxylic acids such as butyric acid, isobutyric acid, oxalic acid, malonic acid, succinic acid, acrylic acid, crotonic acid, isocrotonic acid, 3-butenoic acid, methacrylic acid, 4-pentenoic acid and the like, alicyclic carboxylic acids such as 1,1-cyclohexane dicarboxylic acid, 1,2-cyclohexane dicarboxylic acid, 1,3-cyclohexane dicarboxylic acid, 1,4-cyclohexane dicarboxylic acid, 1,1-cyclohexyl diacetic acid and the like, and aromatic carboxylic acids having a hydroxyl group, nitro group, carboxyl group, vinyl group and the like as a substituent such as p-hydroxy benzoic acid, o-hydroxy benzoic acid, 2-hydroxy-3-nitro benzoic acid, 3,5-dinitro benzoic acid, 2-nitro benzoic acid, 2,4-dihydroxy benzoic acid, 2,5-dihydroxy benzoic acid, 2,6-dihydroxy benzoic acid, 3,4-dihydroxy benzoic acid, 3,5-dihydroxy benzoic acid, 2-vinyl benzoic acid, 4-vinyl benzoic acid, phthalic acid, terephthalic acid, isophthalic acid and the like, of which the aromatic carboxylic acids are preferable in respect of their adequate acidity. Salicylic acid, i.e. o-hydroxy benzoic acid, is more preferable in respect of its good solubility in the organic solvents of the composition and the good pattern-forming behavior on the substrates of various materials. The amount of the above mentioned carboxylic acid compound in the inventive photoresist composition is, when added, in the range from 0.01 to 10% by weight or, preferably, from 0.05 to 2.0% by weight based on the component (A).

The chemical-sensitization photoresist composition is used preferably in the form of a uniform solution prepared by dissolving the above described essential and optional ingredients in an organic solvent. Examples of suitable organic solvents include: ketone solvents such as acetone, methyl ethyl ketone, cyclohexanone, methyl isoamyl ketone and 2-heptanone; polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof; cyclic ether solvents such as dioxane; ester solvents such as methyl lactate, ethyl lactate, methyl acetate, ethyl acetate, butyl acetate, methyl pyruvate, ethyl pyruvate, methyl methoxypropionate and ethyl ethoxypropionate; and amide solvents such as N,N-dimethyl formamide, N,N-dimethyl acetamide and N-methyl-2-pyrrolidone. These organic solvents can be used either singly or as a mixture of two kinds or more according to need.

It is of course optional that the chemical-sensitization photoresist composition of the present invention is admixed with various known additives having compatibility with the above described essential and optional ingredients. Examples of such an additive include auxiliary resins to improve the properties of the resist film, plasticizers, stabilizers, surface active agents and so on conventionally used as the ingredients in photoresist compositions.

The photolithographic patterning procedure by using the chemical-sensitization photoresist composition can be the same as the procedure by the use of a conventional photoresist composition. Namely, a substrate such as a semiconductor silicon wafer is coated with the photoresist composition by using a suitable coating machine such as spinners to form a coating layer of the composition followed by drying to give a dried photoresist layer which is pattern-wise exposed to actinic rays such as ultraviolet light, deep ultraviolet light, excimer laser beams and the like, for example, on a minifying projection exposure machine through a photomask bearing a desired pattern or irradiated pattern-wise by scanning with electron beams to form a latent image of the pattern followed by a post-exposure baking treatment.

Thereafter, the latent image of the pattern is developed with an aqueous alkaline solution as a developer such as a 1 to 10% by weight aqueous solution of tetramethylammonium hydroxide to form a patterned resist layer having high fidelity to the photomask pattern.

One of the advantages with the inventive photoresist composition is that the stability of the latent image of the pattern formed by the pattern-wise exposure to light is high before the post-exposure baking treatment in addition to the advantages of high photosensitivity of the photoresist layer, excellent contrast, high film thickness retention and high resolution of the pattern as well as excellent cross sectional profile of the pattered resist layer so that the inventive photoresist composition is useful in the manufacture of semiconductor devices in which ultrafine patterning is required.

In the following, the chemical-sensitization photoresist composition of the invention is illustrated in more detail by way of Examples and Comparative Examples as preceded by a description of the synthetic procedures of several diazo-methane compounds, in which the positive-working photoresist compositions were evaluated for the following items by the testing procedures described there.

(1) Photosensitivity

A silicon wafer was coated with the photoresist composition under testing by using a spinner to form a coating layer which was dried by heating on a hot plate at 90° C. for 90 seconds to give a dried photoresist layer having a thickness of 0.7 $\mu$m. The photoresist layer was pattern-wise exposed to ultraviolet light on a minifying projection exposure machine (Model NSR-2005EX8A, manufactured by Nikon Co.) in an exposure dose increased step-wise with 1 mJ/cm$^2$ increments to form a latent image of the pattern followed by a post-exposure baking treatment at 110° C. for 90 seconds. Subsequently, the thus pattern-wise exposed photoresist layer was immediately subjected to a development treatment by using a 2.38% by weight aqueous solution of tetramethylammonium hydroxide for 60 seconds at 23° C. followed by rinse in a running water stream for 30 seconds and drying. The minimum exposure dose in mJ/cm$^2$ was recorded as a measure of the photosensitivity of the composition by which the resist layer in the exposed areas could be completely dissolved away in the development treatment.

(2) Pattern Resolution

The resolution of the patterned resist layer was estimated in terms of the critical resolution at the exposure dose which was sufficient for reproduction of a mask pattern of 0.25 $\mu$m line width by undertaking the same patterning procedure as in (1) above.

(3) Cross Sectional Profile of Patterned Resist Layer

A resist layer in a line-and-space pattern of 0.25 $\mu$m line width was obtained in the same manner as in (1) described above and the cross sectional profile thereof was examined and recorded in two rating of: A when the cross section had an orthogonal profile; and B when the cross section was narrowed toward the top or when waviness was found on the side line.

(4) Stability of Latent Image Before Development

A resist layer patterned in a line-and-space pattern of 0.25 $\mu$m line width was prepared in the same manner as in (1) above excepting for standing of the pattern-wise exposed photoresist layer for 60 minutes at room temperature before the post-exposure baking treatment at 110° C. for 90 seconds followed by the development treatment. The cross sectional profile of the thus obtained line-and-space patterned resist layer was examined on a scanning electron microscopic photograph to record the results in five ratings of: 5 when the ratio of the line width to the space width was 1:1; 3 when the line width was larger than 0.25 $\mu$m and the space width was smaller than 0.25 $\mu$m; and 1 when no resolution of the pattern could be obtained, the intermediate conditions of 5 and 3 and of 3 and 1 being rated as 4 and 2, respectively.

(5) Film Thickness Retention

Patterning of the photoresist layer was undertaken in the same manner as in (1) described above and recording was made of the ratio of the film thickness in the unexposed areas to the film thickness before the development treatment in %.

Synthesis 1

A solution prepared by dissolving 50 g (0.40 mole) of 4-hydroxybenzene thiol and 1.5 g (0.006 mole) of tetrabutylammonium bromide in 250 g of acetone was admixed with 43 g (0.31 mole) of potassium carbonate followed by dropwise addition of 40 g (0.23 mole) of methylene bromide over a period of 30 minutes at 45° C. This reaction mixture was agitated for further 8 hours at the same temperature followed by removal of potassium bromide precipitated in the mixture and removal of the solvent by distillation under reduced pressure at 40° C. The reaction product left as the distillation residue was admixed with 500 g of water and extracted with 600 g of ethyl acetate. The extract solution was freed from the solvent by distillation to give an oily yellow product which was bis(4-hydroxyphenylthio) methane.

In the next place, 50 g (0.19 mole) of the above obtained bis(4-hydroxyphenylthio) methane were dissolved in 275 g of ethyl alcohol with addition of 5 g (0.02 mole) of sodium tungstate followed by dropwise addition of 162 g (1.67 mole) of a 35% aqueous hydrogen peroxide solution over a period of 1 hour at 50° C. After further continued agitation for 5 hours at 50° C., the reaction mixture was neutralized with a 30% aqueous solution of sodium hydroxide and the white crystalline precipitates formed in the reaction mixture were collected by filtration, which could be identified to be bis(4-hydroxyphenylsulfonyl) methane.

Thereafter, 30 g (0.09 mole) of the above obtained bis-(4-hydroxyphenylsulfonyl) methane were dissolved in 160 g of dimethyl formamide and 28 g (0.20 mole) of potassium carbonate were added to the solution, which was dropwise admixed with 30 g (0.20 mole) of tert-butyl chloroacetate over a period of 30 minutes at room temperature. After further continued agitation for 3 hours at 80° C., the reaction mixture was cooled down to room temperature, freed from potassium carbonate by filtration and washed with 1200 g of a diluted hydrochloric acid to give 42.0 g of an oily yellow product which could be identified to be bis(4-tert-butoxycarbonylmethyloxyphenylsulfonyl) methane.

Finally, 30 g (0.054 mole) of the above obtained bis(4-tert-butoxycarbonylmethyloxyphenylsulfonyl) methane and 15 g (0.076 mole) of tosyl azide were dissolved in 300 g of ethyl alcohol and the solution was dropwise admixed with 12.5 g (0.12 mole) of triethylamine over a period of 30 minutes at room temperature. After further continued agitation of the reaction mixture for 1.5 hours at room temperature, the crystalline precipitates formed in the reaction mixture were collected by filtration followed by repetition of recrystallization of the product from acetonitrile to give 13.0 g of a purified product having a melting point of 98° C. and thermal decomposition point of 114° C., which could be identified to be the desired bis(4-tert-butoxycarbonylmethyloxyphenylsulfonyl) diazomethane.

Figure 1B:
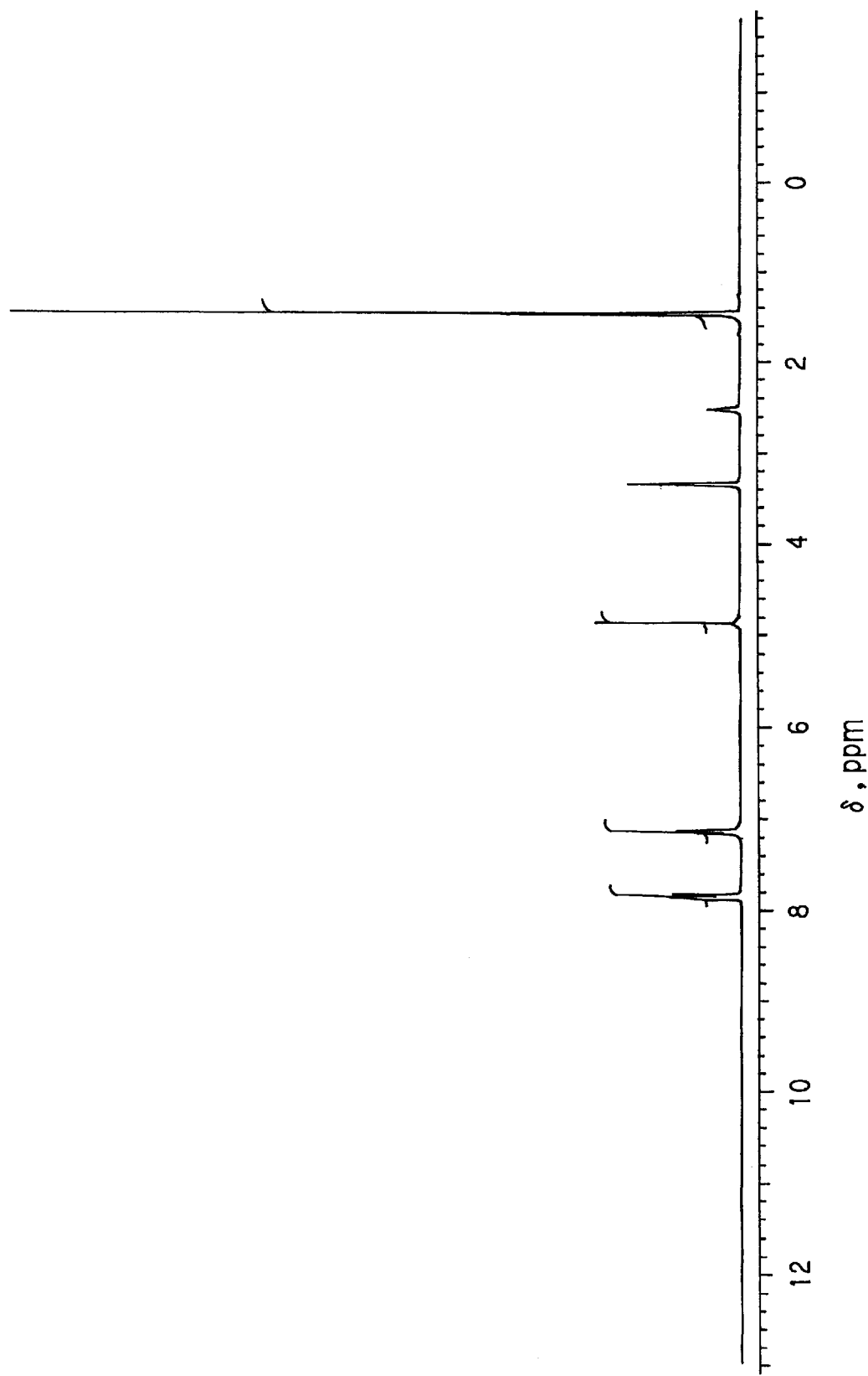

FIGS. 1A and 1B of the accompanying drawing are an infrared absorption spectrum and a $^1$H-NMR absorption spectrum, respectively, of this product compound.

Synthesis 2

The synthetic procedure was substantially the same as in Synthesis 1 described above excepting for the replacement of 30 g of tert-butyl chloroacetate with 33 g of tert-butyl 3-chloropropionic acid to give 13.5 g of bis(4-tert-butoxycarbonylethyloxyphenylsulfonyl) diazomethane.

Synthesis 3

A solution prepared by dissolving 5 g (0.014 mole) of bis(2-hydroxycyclohexylsulfonyl) diazomethane and 3.5 g (0.042 mole) of 3,4-dihydro-2H-pyran in 50 g of dioxane was admixed with 0.1 g of pyridinium p-toluenesulfonate and agitated for 40 hours at room temperature. Thereafter, the reaction mixture was admixed with 50 g of water and extracted with 30 g of ethyl acetate. The extract solution was freed from the solvent by distillation and the residue was purified by the silica gel chromatography to give 2.0 g of a product which could be identified to be [2-(2-tetrahydropyranyl)oxycyclo-hexylsulfonyl] diazomethane expressed by the structural formula

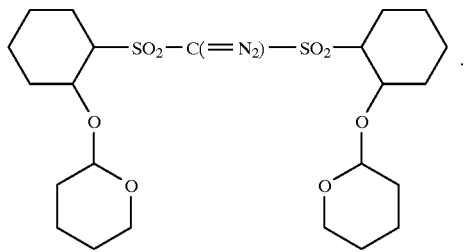

Figure 2A:
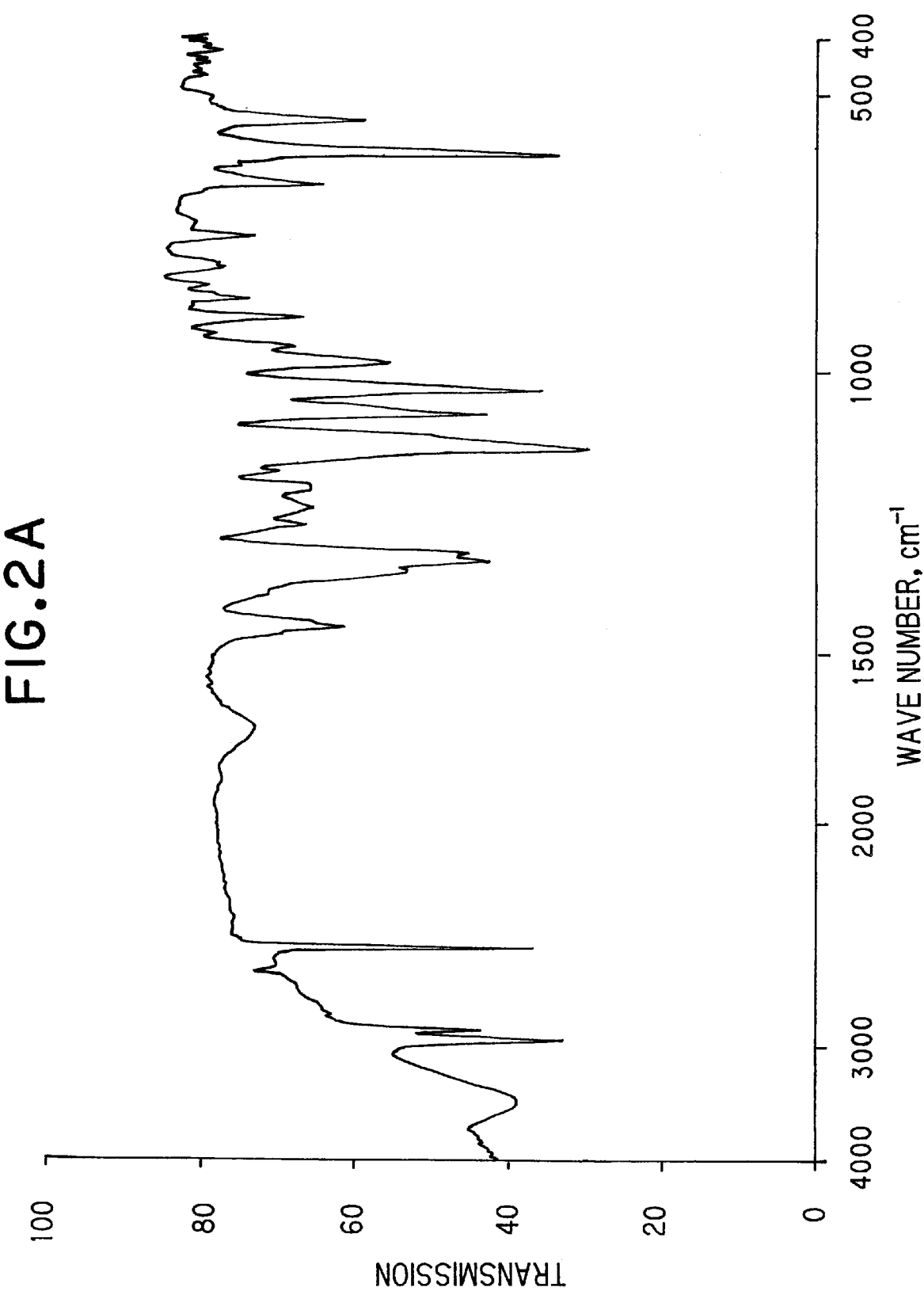
FIGS. 2A and 2B are an infrared absorption spectrum and $^1$H-NMR absorption spectrum, respectively, of the diazomethane compound prepared in Synthesis 3.
Figure 2B:
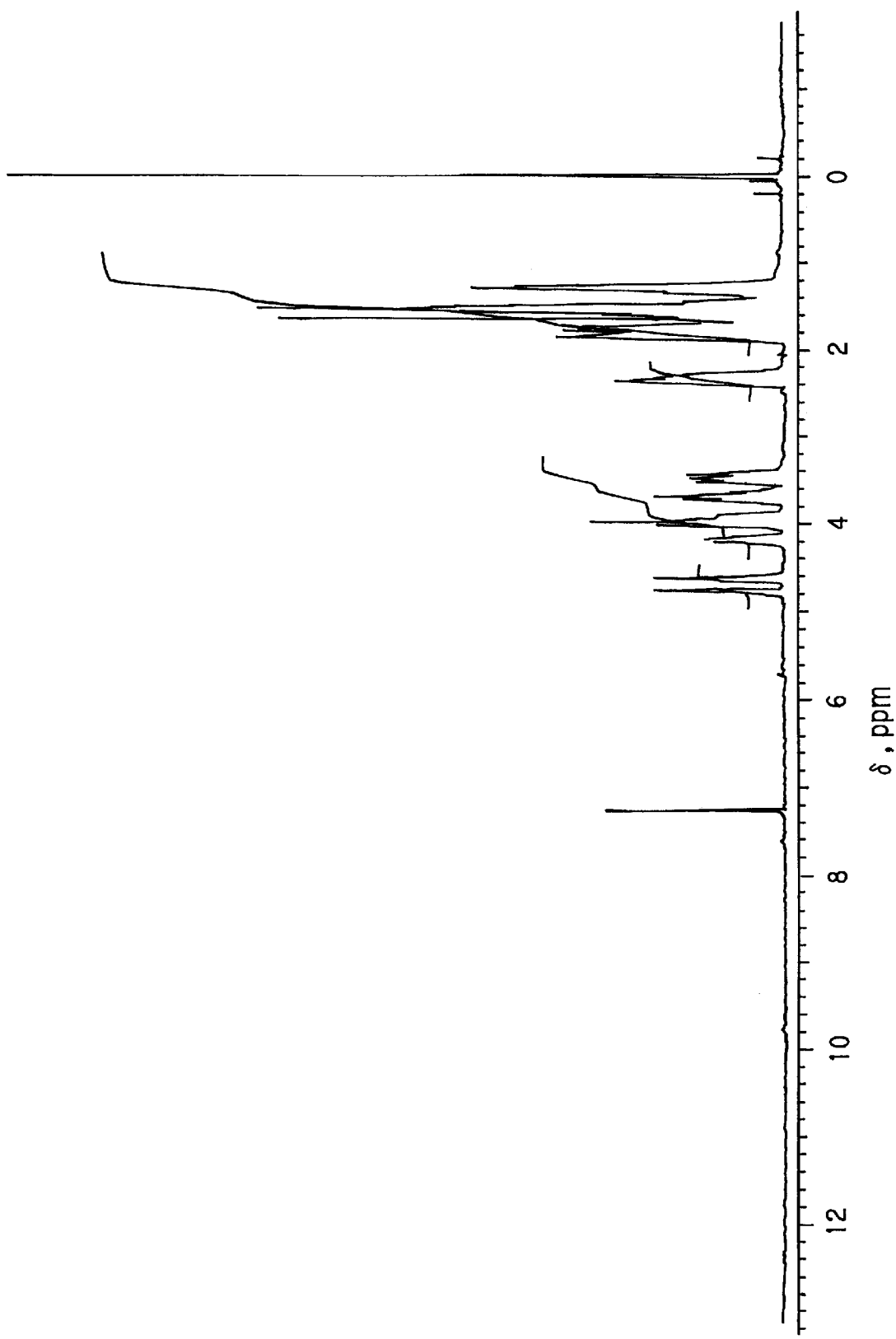

FIGS. 2A and 2B of the accompanying drawing are an infrared absorption spectrum and a $^1$H-NMR absorption spectrum, respectively, of this product compound.

Synthesis 4

A solution of 30 g (0.53 mole) of potassium hydroxide dissolved in 300 g of ethyl alcohol was admixed with 60 g (0.32 mole) of mercapto isoborneol followed by dropwise addition of 28 g (0.16 mole) of methylene bromide at room temperature over a period of 30 minutes. After further continued agitation of this reaction mixture for 3 hours at 50° C., the precipitates of potassium bromide were removed by filtration and the filtrate was, after neutralization with diluted hydrochloric acid, extracted with 500 g of methylene chloride. The extract solution was freed from the solvent by distillation to give 67 g of an oily yellow material which was bis[2-hydroxy-7,7-dimethylbicyclo[2.2.1]heptanylmethylthio] methane.

In the next place, 67 g (0.17 mole) of the above obtained compound were dissolved in 300 g of ethyl alcohol along with addition of 0.6 g of sodium tungstate. This reaction mixture was admixed dropwise with 200 g (2.06 moles) of a 35% aqueous solution of hydrogen peroxide at 45° C. over a period of 30 minutes followed by further continued agitation for 20 hours at 50° C. Thereafter, the reaction mixture was admixed with 1000 g of water to obtain 51 g of a white crystalline product as the precipitates in the reaction mixture, which was bis[2-hydroxy-7,7-dimethylbicyclo[2.2.1]heptanylmethylsulfonyl] methane.

Thereafter, 20 g (0.045 mole) of the above obtained bis-[2-hydroxy-7,7-dimethylbicyclo[2.2.1]heptanylmethylsulfonyl] methane and 10 g (0.051 mole) of tosyl azide were dissolved in 80 g of ethyl alcohol and the solution was admixed dropwise with 300 g of a 10% aqueous solution of potassium hydroxide (0.53 mole) over a period of 30 minutes at room temperature followed by further continued agitation for 2 hours at room temperature. The crystalline material precipitated in the reaction mixture was collected by filtration and dried to give 6.5 g of bis[2-hydroxy-7,7-dimethylbicyclo[2.2.1]heptanylmethylsulfonyl] diazomethane.

A solution prepared by dissolving 5.0 g (0.011 mole) of this compound and 2.9 g (0.033 mole) of 3,4-dihydro-2H-pyran in 50 g of dioxane was admixed with 0.1 g of pyridinium p-toluenesulfonate and agitated for 40 hours at room temperature. Further, the reaction mixture was admixed with 50 g of water and extracted with 30 g of ethyl acetate. The extract solution was freed from the solvent by distillation and the residue was purified by the method of silica gel chromatography to give 1.5 g of a product which could be identified to be bis[2-(2-tetrahydropyranyl)oxy-7,7-dimethy]bicyclo[2.2.1]heptanylmethylsulfonyl] diazomethane expressed by the structural formula

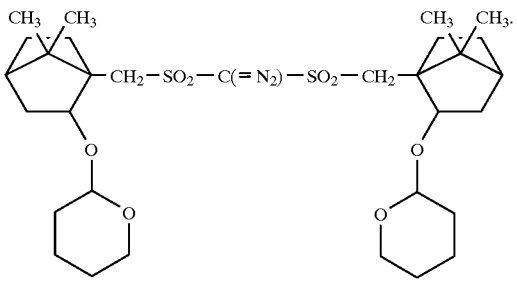

Synthesis 5

A solution prepared by dissolving 50 g (0.38 mole) of 2-hydroxycyclohexane thiol in 50 g of ethyl alcohol was admixed with 140 g of a 15% by weight ethyl alcohol solution of potassium hydroxide (0.37 mole) and further admixed dropwise with 33 g (0.19 mole) of methylene bromide over a period of 30 minutes at room temperature followed by further continued agitation for 1.5 hours at room temperature. After removal of the precipitated potassium bromide by filtration, the filtrate was admixed with 0.6 g (0.002 mole) of sodium tungstate and further admixed dropwise with 95 g (0.98 mole) of a 35% by weight aqueous solution of hydrogen peroxide over a period of 1 hour at 50° C. followed by further continued agitation for 20 hours at the same temperature. The reaction mixture was admixed with 300 g of water and extracted with 300 g of ethyl acetate and the extract solution was freed from the solvent by distillation to give 36.6 g of an oily yellow material which could be identified to be bis(2-hydroxycyclo-hexylsulfonyl) methane.

In the next place, 25 g (0.075 mole) of this compound and 15 g (0.075 mole) of tosyl azide were dissolved in 80 g of ethyl alcohol and the solution was admixed dropwise with 85 g of a 10% by weight aqueous solution of potassium hydroxide (0.15 mole) over a period of 30 minutes at room temperature. The reaction mixture was admixed with 125 g of water followed by further continued agitation for 1 hour at room temperature and the crystalline material precipitated therein was collected by filtration and dried to give 8.1 g of bis(2-hydroxycyclohexylsulfonyl) diazomethane.

Finally, 5 g (0.014 mole) of this compound and 3 g (0.042 mole) of ethyl vinyl ether were dissolved in 50 g of dioxane and the solution was admixed with 0.1 g of pyridinium p-toluenesulfonate followed by agitation for 20 hours at room temperature. The reaction mixture was extracted with 30 g of ethyl acetate and the extract solution was freed from the solvent by distillation to leave a residue which was purified by the method of silica gel chromatography to give 2.0 g of a product which could be identified to be bis[2-(1-ethoxyethyloxy)cyclohexylsulfonyl] diazomethane expressed by the structural formula

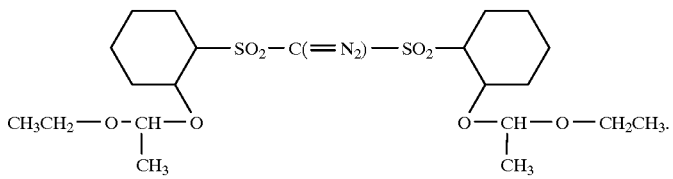

Figure 3A:
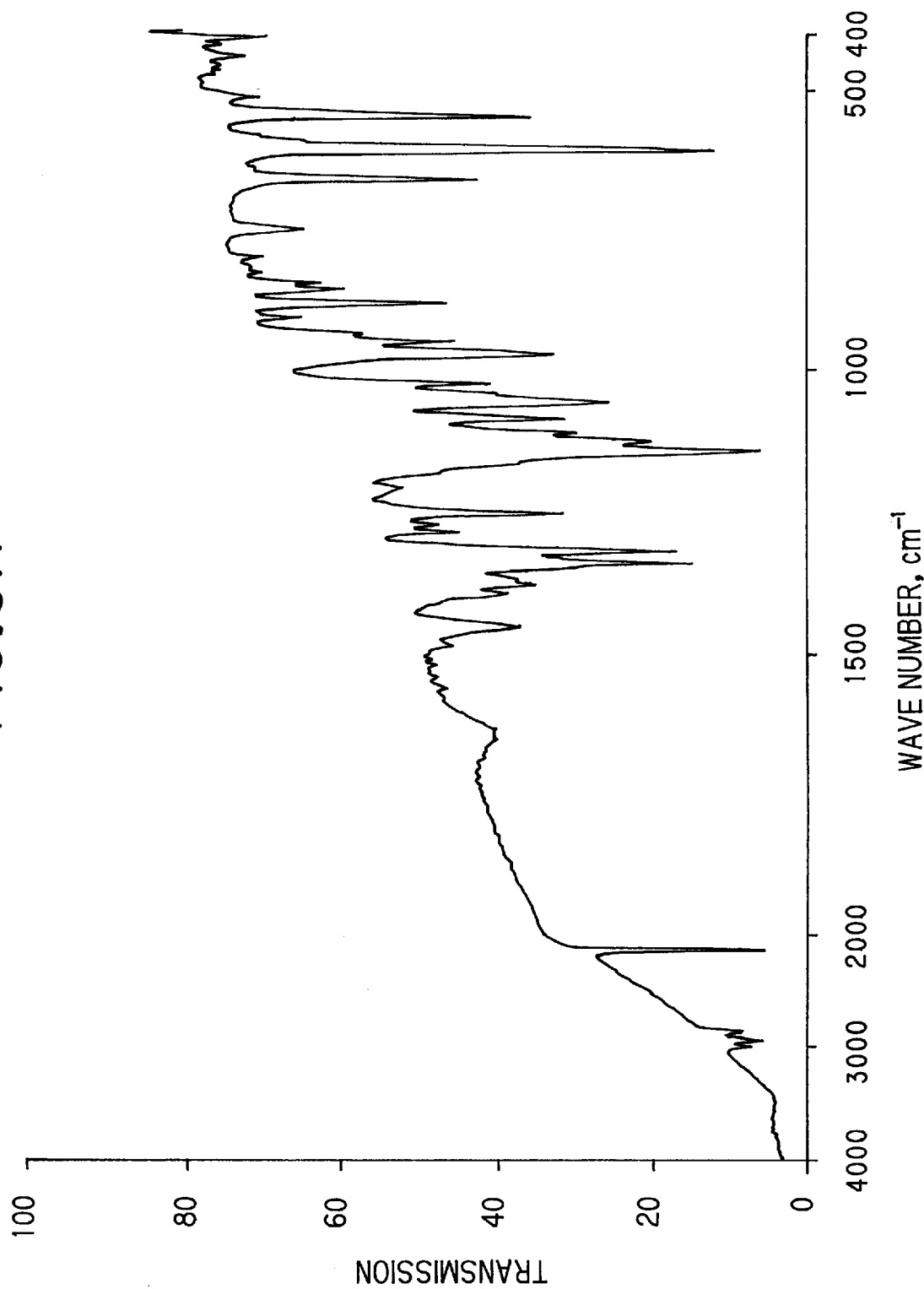
FIGS. 3A and 3B are an infrared absorption spectrum and $^1$H-NMR absorption spectrum, respectively, of the diazomethane compound prepared in Synthesis 5.
Figure 3B:
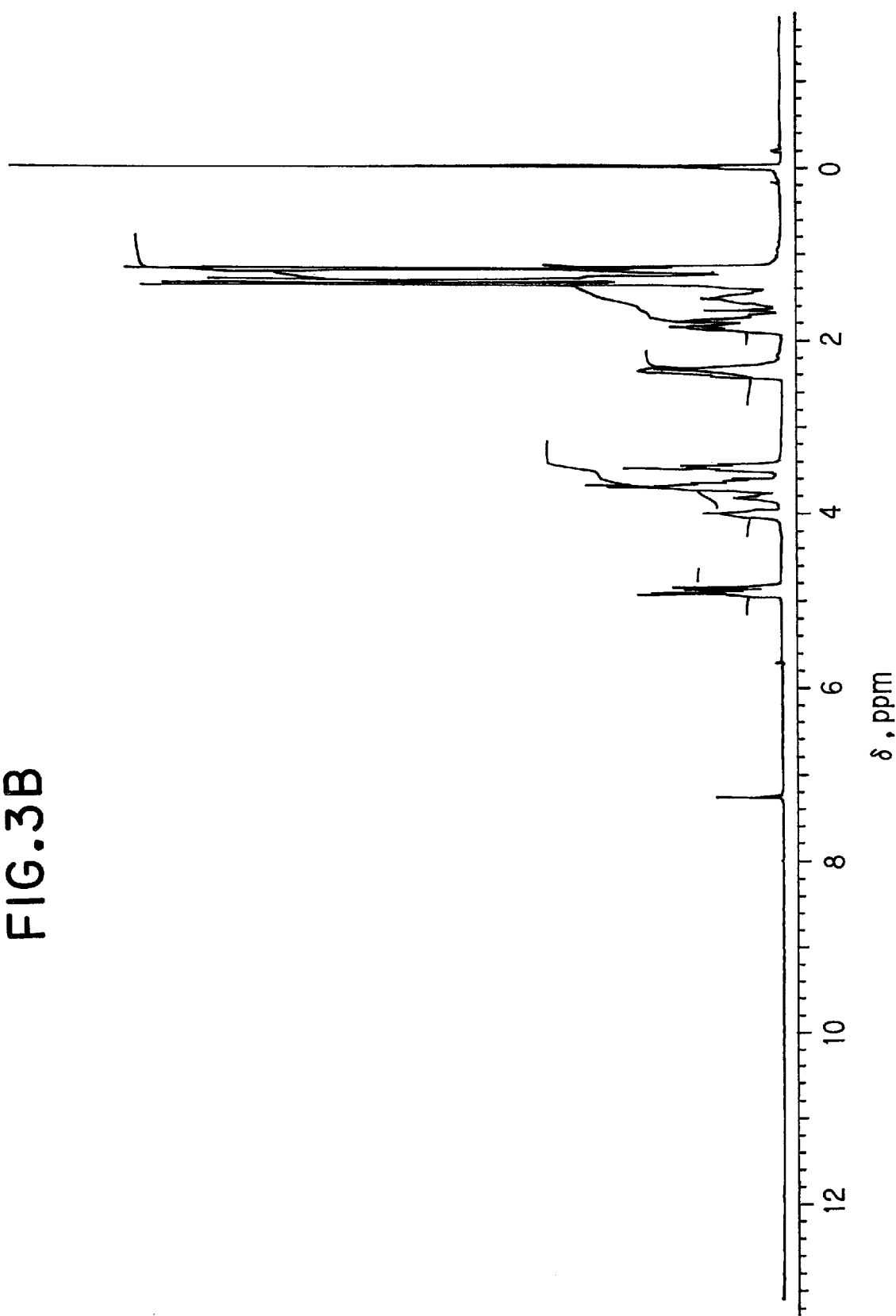

FIGS. 3A and 3B are an infrared absorption spectrum and a $^1$H-NMR absorption spectrum, respectively, of this product.

The infrared absorption spectrum has an absorption band at 2120 cm$^{-1}$ assignable to CN$_2$. The $^1$H-NMR absorption spectrum taken with CDCl$_3$ as the solvent has peaks at δ=1.1 to 2.4 ppm (28H, methylene in cyclohexane rings, —CH$_2$—CH$_3$), 3.4 to 4.0 ppm (8H, methylene in cyclohexane rings, —CH$_2$—CH$_3$) and 4.8 to 4.9 ppm (2H, CH(CH$_3$)—O—).

Synthesis 6

A solution prepared by dissolving 30 g (0.53 mole) of potassium hydroxide in 300 g of ethyl alcohol was admixed with 60 g (0.32 mole) of mercapto isoborneol and further admixed dropwise with 28 g (0.16 mole) of methylene bromide over a period of 30 minutes at room temperature followed by further continued agitation for 3 hours at 50° C. The reaction mixture was freed from potassium bromide precipitated therein by filtration and the filtrate was neutralized with diluted hydrochloric acid and extracted with 500 g of methylene chloride. The extract solution was freed from the solvent by distillation to give 67 g of an oily yellow material which could be identified to be bis[2-hydroxy-7,7-dimethylbicyclo[2.2.1]heptanylmethylthio] methane.

Thereafter, 67 g (0.17 mole) of this compound were dissolved in 300 g of ethyl alcohol and the solution was admixed with 0.6 g of sodium tungstate and further admixed dropwise with 200 g (2.06 moles) of a 35% by weight aqueous solution of hydrogen peroxide over a period of 30 minutes at 45° C. followed by further continued agitation for 20 hours at 50° C. The reaction mixture was then admixed with 1000 g of water and the crystalline material precipitated in the mixture was collected by filtration and dried to give 51 g of a white crystalline product which could be identified to be bis[2-hydroxy-7,7-dimethylbicyclo[2.2.1]heptanylmethylsulfonyl] methane.

In the next place, 20 g (0.045 mole) of this compound and 10 g (0.051 mole) of tosyl azide were dissolved in 80 g of ethyl alcohol and the solution was admixed dropwise with 300 g of a 10% by weight aqueous solution of potassium hydroxide (0.53 mole) over a period of 30 minutes at room temperature followed by further continued agitation for 2 hours at room temperature. The precipitates formed in the reaction mixture were collected by filtration and dried to give 6.5 g of a crystalline product which could be identified to be bis[2-hydroxy-7,7-dimethylbicyclo[2.2.1] heptanylmethylsulfonyl] diazomethane.

Finally, 5 g (0.011 mole) of this compound and 3 g (0.042 mole) of ethyl vinyl ether were dissolved in 50 g of dioxane and the solution was admixed with 0.1 g of pyridinium p-toluenesulfonate and agitated for 20 hours at room temperature. The reaction mixture was then admixed with 50 g of a saturated aqueous solution of potassium carbonate and the precipitates formed in the reaction mixture were collected by filtration and purified by repeating re-crystallization from acetonitrile to give 1.7 g of a product which was bis[2-(1-ethoxyethyloxy)-7,7-dimethylbicyclo[2.2.1]heptanylmethylsulfonyl] diazomethane expressed by the structural formula

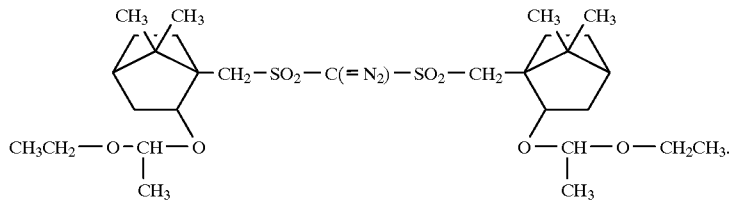

Figure 4A:
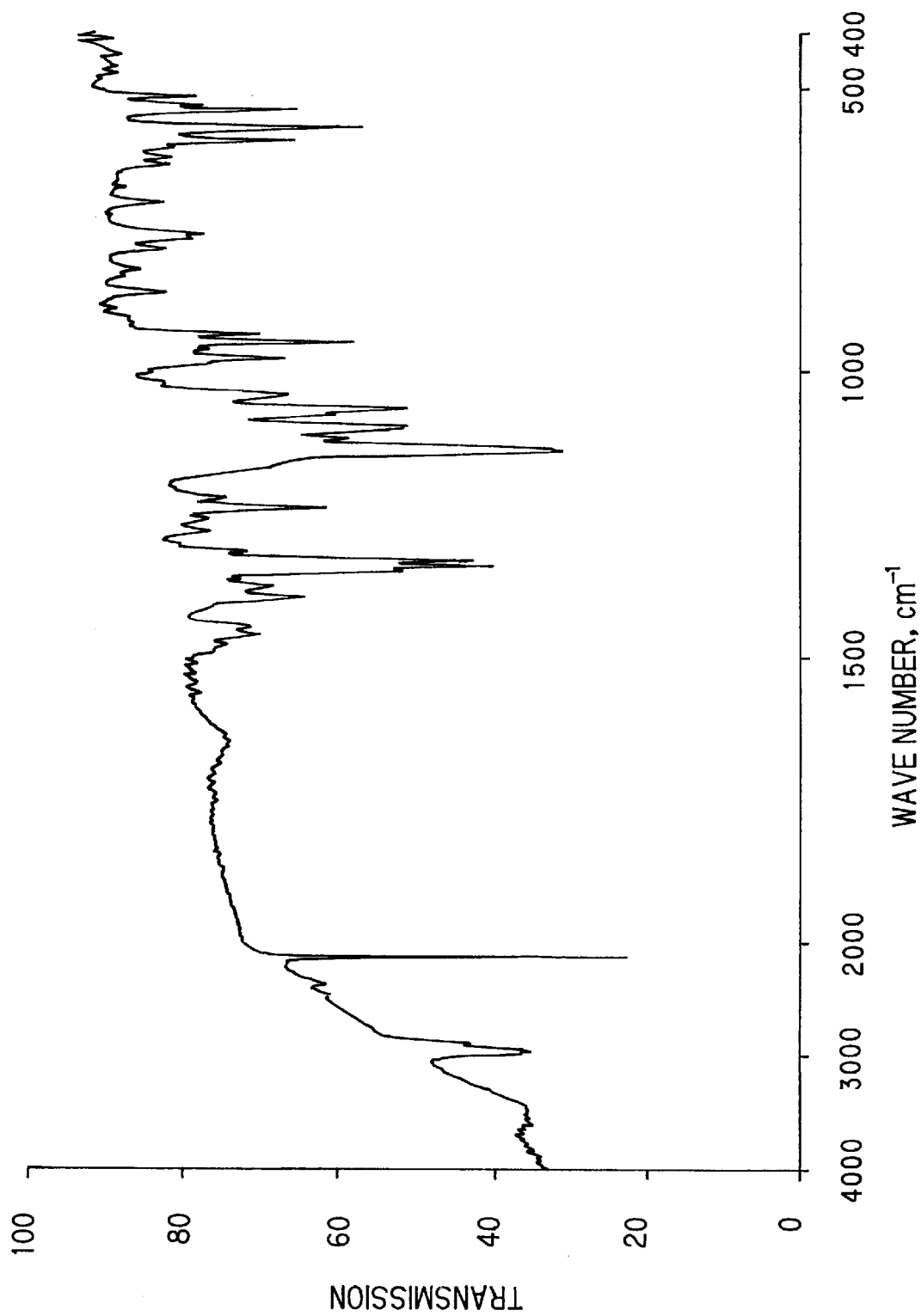
FIGS. 4A and 4B are an infrared absorption spectrum and $^1$H-NMR absorption spectrum, respectively, of the diazomethane compound prepared in Synthesis 6.
Figure 4B:
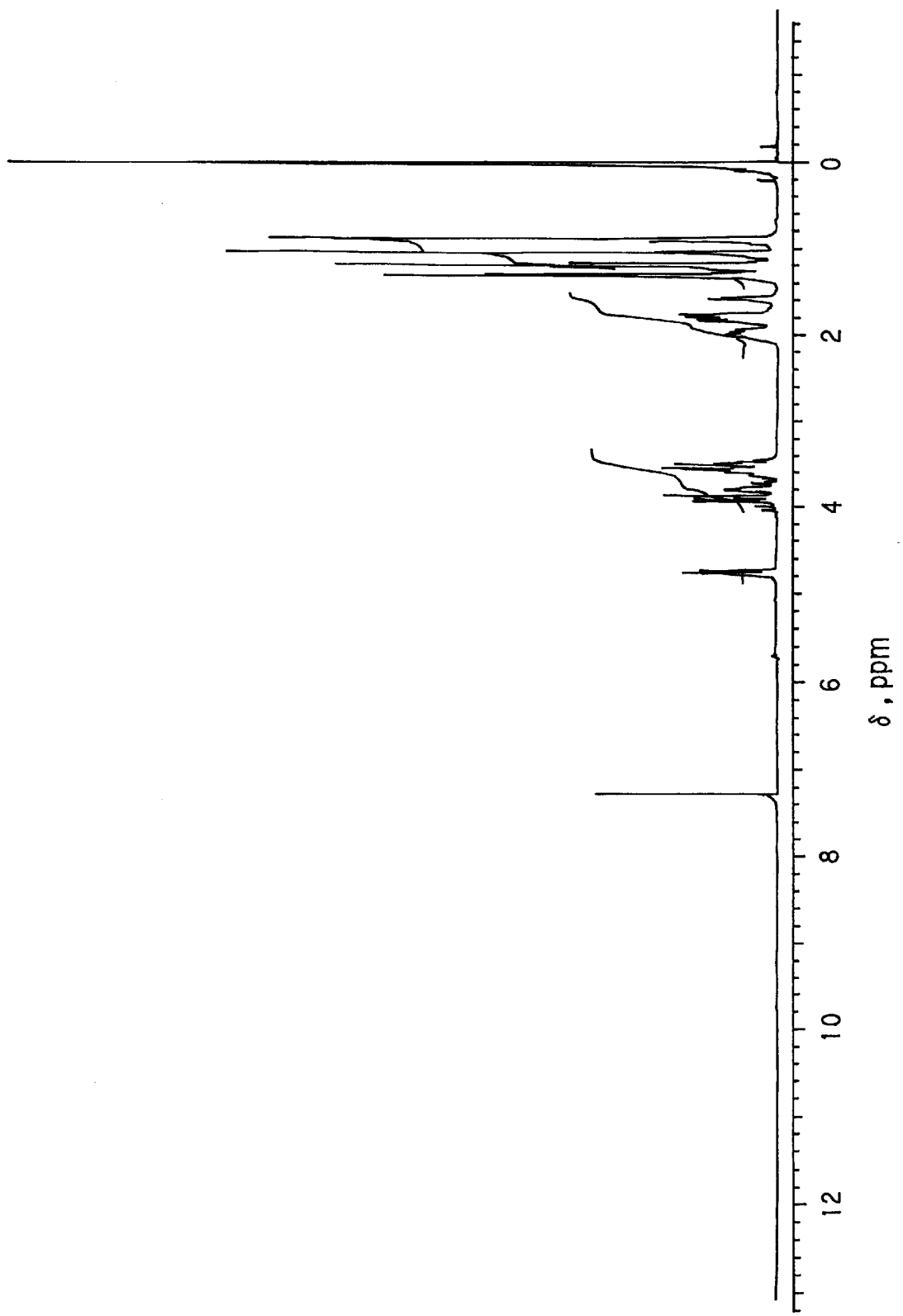

FIGS. 4A and 4B are an infrared absorption spectrum and a $^1$H-NMR absorption spectrum, respectively, of this compound.

EXAMPLE 1

A positive-working chemical-sensitization photoresist composition was prepared in the following manner. Thus, 30 parts by weight of a first polyhydroxystyrene resin having a weight-average molecular weight of 10000, which was substituted by tert-butyloxycarbonyl groups for 39% of the hydroxyl groups, 70 parts by weight of a second polyhydroxystyrene resin having a weight-average molecular weight of 10000, which was substituted by ethoxyethyl groups for 39% of the hydroxyl groups, 3 parts by weight of bis(4-tert-butoxycarbonyloxyphenylsulfonyl) diazomethane as the acid-generating agent, 0.3 part by weight of triethyl amine and 0.2 part by weight of salicylic acid were dissolved in 490 parts by weight of propyleneglycol monomethyl ether acetate and the solution was filtered through a membrane filter of 0.2 μm pore diameter to give a photoresist solution, which was subjected to the evaluation tests in the above described procedures to give the results shown in Table 1 below.

EXAMPLE 2

The experimental procedure was just the same as in Example 1 excepting for the replacement of the acid-generating agent with the same amount of bis[4-(2-tetrahydropyranyl)oxyphenylsulfonyl] diazomethane. The results of the evaluation tests are shown also in Table 1.

EXAMPLE 3

The experimental procedure was just the same as in Example 1 excepting for the replacement of the acid-generating agent with the same amount of bis[2-(2-tetrahydropyranyl)oxycarbonylphenylsulfonyl] diazomethane. The results of the evaluation tests are shown also in Table 1.

EXAMPLE 4

The experimental procedure was just the same as in Example 1 excepting for the replacement of the acid-generating agent with the same amount of bis(4-tert-butoxycarbonylmethyloxyphenylsulfonyl) diazomethane. The results of the evaluation tests are shown also in Table 1.

EXAMPLE 5

The experimental procedure was substantially the same as in Example 1 excepting for the replacement of 3 parts by weight of the diazomethane compound as the acid-generating agent with 7 parts by weight of the diazomethane compound prepared in Synthesis 1. The results of the evaluation tests are shown also in Table 1.

EXAMPLE 6

The experimental procedure was substantially the same as in Example 1 excepting for the replacement of 3 parts by weight of the diazomethane compound as the acid-generating agent with 7 parts by weight of the diazomethane compound prepared in Synthesis 3. The results of the evaluation tests are shown also in Table 1.

EXAMPLE 7

The experimental procedure was substantially the same as in Example 1 excepting for the replacement of 3 parts by weight of the diazomethane compound as the acid-generating agent with 7 parts by weight of the diazomethane compound prepared in Synthesis 4. The results of the evaluation tests are shown also in Table 1.

EXAMPLE 8

The experimental procedure was substantially the same as in Example 1 excepting for the replacement of 3 parts by weight of the diazomethane compound as the acid-generating agent with 7 parts by weight of the diazomethane compound prepared in Synthesis 5. The results of the evaluation tests are shown also in Table 1.

EXAMPLE 9

The experimental procedure was substantially the same as in Example 1 excepting for the replacement of 3 parts by weight of the diazomethane compound as the acid-generating agent with 7 parts by weight of the diazomethane compound prepared in Synthesis 6. The results of the evaluation tests are shown also in Table 1.

Comparative Example 1

The experimental procedure was just the same as in Example 1 excepting for the replacement of 3 parts by weight of the acid-generating agent with 5 parts by weight of pyrogallol trimesylate. The results of the evaluation tests are shown also in Table 1.

Comparative Example 2

The experimental procedure was just the same as in Example 1 excepting for the replacement of the acid-generating agent with the same amount of bis(4-tert-butylphenyl) iodonium trifluoromethane sulfonate. The results of the evaluation tests are shown also in Table 1.

Comparative Example 3

The experimental procedure was just the same as in Example 1 excepting for the replacement of 3 parts by weight of the acid-generating agent with 5 parts by weight of bis(cyclohexyl sulfonyl) diazomethane. The results of the evaluation tests are shown also in Table 1.

TABLE 1

| | | Photo-sensitivity, mJ/cm$^2$ | Pattern resolution, μm | Cross sectional profile | Stability of latent image before development | Film thickness retention, % |
|---|---|---|---|---|---|---|
| Example | 1 | 10 | 0.22 | A | 4 | 98 |
| | 2 | 10 | 0.22 | A | 4 | 98 |
| | 3 | 9 | 0.20 | A | 4 | 98 |
| | 4 | 10 | 0.22 | A | 4 | 98 |
| | 5 | 9 | 0.22 | A | 4 | 98 |
| | 6 | 23 | 0.21 | A | 4 | 98 |
| | 7 | 25 | 0.22 | A | 4 | 98 |
| | 8 | 15 | 0.20 | A | 4 | 98 |
| | 9 | 18 | 0.21 | A | 4 | 98 |
| Comparative Example | 1 | 20 | 0.23 | B | 1 | 98 |
| | 2 | 7 | 0.22 | B | 1 | 99 |
| | 3 | 15 | 0.20 | A | 4 | 96 |

What is claimed is:

1. A diazomethane compound represented by the general formula

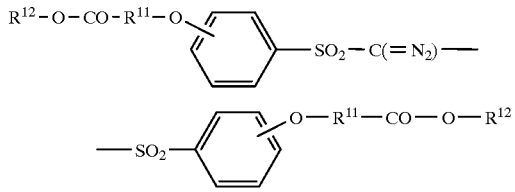

in which each $R^{11}$ is, independently from the other, a lower alkylene group having 1 to 4 carbon atoms and each $R^{12}$ is, independently from the other, a tertiary alkyl group having 4 to 8 carbon atoms.

2. The diazomethane compound as claimed in claim 1 in which $R^{11}$ is a methylene group and $R^{12}$ is a tert-butyl group.

3. The diazomethane compound as claimed in claim 1 in which $R^{11}$ is an ethylene group and $R^{12}$ is a tert-butyl group.

4. A diazomethane compound represented by the general formula

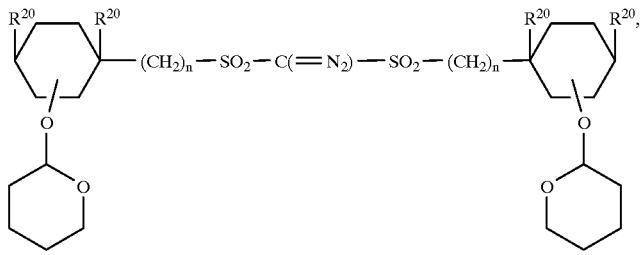

in which the two $R^{20}$ groups on the same ring structure are each a hydrogen atom or jointly form an endo (dimethylmethylene) group and each of the subscripts n is, independently from the other, a number of 0 or 1.

5. The diazomethane compound as claimed in claim 4 in which $R^{20}$ is a hydrogen atom and n is a number of 0.

6. The diazomethane compound as claimed in claim 4 in which the two $R^{20}$ on the same ring structure jointly form an endo(dimethylmethylene) group and n is a number of 1.

7. A diazomethane compound represented by the general formula

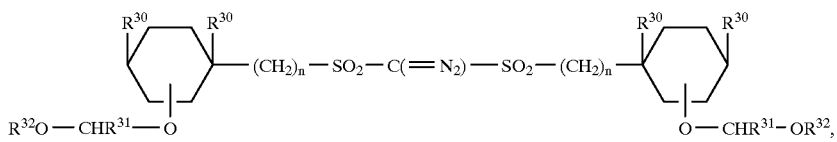

in which the two $R^{30}$ groups on the same ring structure are each a hydrogen atom or jointly form an endo (dimethylmethylene) group, each $R^{31}$ is, independently from the other, a lower alkyl group having 1 to 4 carbon atoms, each $R^{32}$ is, independently from the other, a lower alkyl group having 1 to 4 carbon atoms and each of the subscript n is, independently from the other, a number of 0 or 1.

8. The diazomethane compound as claimed in claim 7 in which $R^{30}$ is a hydrogen atom, $R^{31}$ is a methyl group, $R^{32}$ is an ethyl group and n is a number of 0.

9. The diazomethane compound as claimed in claim 7 in which the two $R^{30}$ on the same ring structure jointly form an endo(dimethylmethylene) group, $R^{31}$ is a methyl group, $R^{32}$ is an ethyl group and n is a number of 1.

* * * * *